United States Patent
Dong et al.

(10) Patent No.: US 10,593,902 B2
(45) Date of Patent: Mar. 17, 2020

(54) QUANTUM DOT LIGHT EMITTING DEVICES (QLEDS) AND METHOD OF MANUFACTURE

(71) Applicant: University of Central Florida Research Foundation, Inc., Orlando, FL (US)

(72) Inventors: Yajie Dong, Orlando, FL (US); Hao Chen, Orlando, FL (US); Shin-Tson Wu, Orlando, FL (US); Juan He, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 16/143,068

(22) Filed: Sep. 26, 2018

(65) Prior Publication Data
US 2019/0103571 A1    Apr. 4, 2019

Related U.S. Application Data

(60) Provisional application No. 62/565,253, filed on Sep. 29, 2017.

(51) Int. Cl.
*H01L 51/50* (2006.01)
*H01L 33/06* (2010.01)
(Continued)

(52) U.S. Cl.
CPC .......... *H01L 51/502* (2013.01); *H01L 33/005* (2013.01); *H01L 33/06* (2013.01);
(Continued)

(58) Field of Classification Search
CPC .......................... H01L 51/502; H01L 51/5092
See application file for complete search history.

(56) References Cited

U.S. PATENT DOCUMENTS 8,759,826 B2 * 6/2014 Oikawa ................. B82Y 20/00
    257/13
9,680,132 B1 * 6/2017 Tsai .................... H01L 51/5284
(Continued)

FOREIGN PATENT DOCUMENTS

WO    2006088877 A1    8/2006

OTHER PUBLICATIONS

Chen et al., Flexible Quantum Dot Light-Emitting Devices for targeted Photomedical Applications. Journal of the SID. 2018. vol. 26 (No. 5): 296-303.
(Continued)

*Primary Examiner* — Nicholas J Tobergte
(74) *Attorney, Agent, or Firm* — Molly L. Sauter; Smith & Hopen, P.A.

(57) ABSTRACT

An ultrabright bright quantum dot light-emitting diode (QLED) device and associated method of manufacture. The QLED device includes quantum dots (QD) as emitters and a mixture of metal oxide nanoparticles and alkali metal compounds for simultaneous electron injection and hole blocking to achieve charging balance at high driving current conditions. The ultrabright QLEDs are useful for many light source applications including, but not limited to display, solid state lighting, optical sensor, phototherapy, photomedicine and photobiomedicine.

24 Claims, 11 Drawing Sheets

(51) Int. Cl.
*H01L 33/14* (2010.01)
*H01L 33/18* (2010.01)
*H01L 33/26* (2010.01)
*H01L 33/00* (2010.01)
*H01L 33/42* (2010.01)

(52) U.S. Cl.
CPC .............. *H01L 33/14* (2013.01); *H01L 33/18* (2013.01); *H01L 33/26* (2013.01); *H01L 33/42* (2013.01); *H01L 51/5048* (2013.01); *H01L 51/5092* (2013.01); *H01L 51/5096* (2013.01)

(56) References Cited

U.S. PATENT DOCUMENTS

| | | | |
|---|---|---|---|
| 10,192,932 B2 * | 1/2019 | Steckel | H01L 51/5072 |
| 10,283,672 B2 * | 5/2019 | Kim | H01L 33/06 |
| 2013/0200360 A1 * | 8/2013 | Oikawa | B82Y 20/00 |
| | | | 257/40 |
| 2017/0221969 A1 * | 8/2017 | Steckel | H01L 51/5072 |
| 2018/0230321 A1 * | 8/2018 | Pan | C09D 11/03 |
| 2018/0237649 A1 * | 8/2018 | Pan | C09D 11/36 |
| 2018/0327622 A1 * | 11/2018 | Pan | C09D 11/033 |
| 2018/0346748 A1 * | 12/2018 | Pan | C09D 11/52 |
| 2019/0054689 A1 * | 2/2019 | Rudisill | B33Y 80/00 |

OTHER PUBLICATIONS

Dong et al., Ultra-Bright, Highly Efficient, Low Roll-Off Inverted Quantum-Dot Light Emitting Devices (QLEDs), SID Digest. 2015. vol. 46: 270-273.

* cited by examiner

FIG. 3A
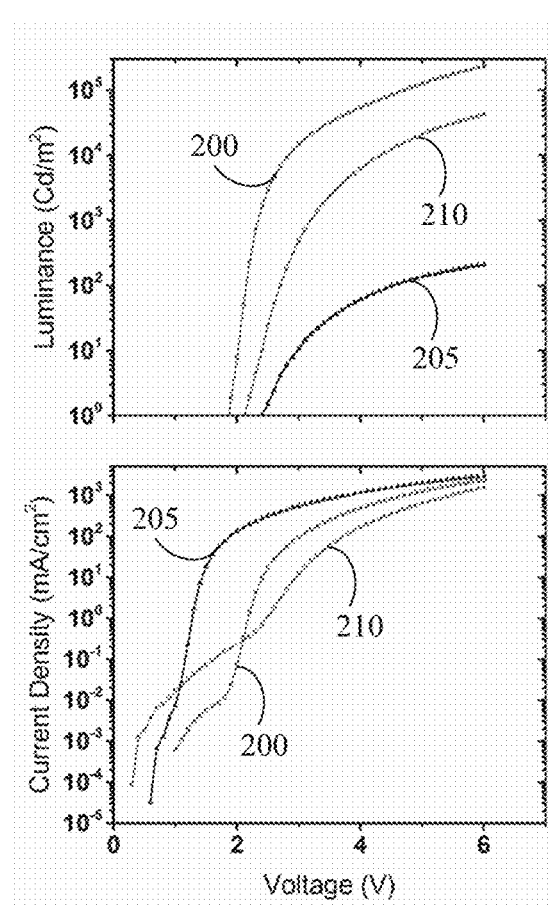
FIG. 3C
FIG. 3B
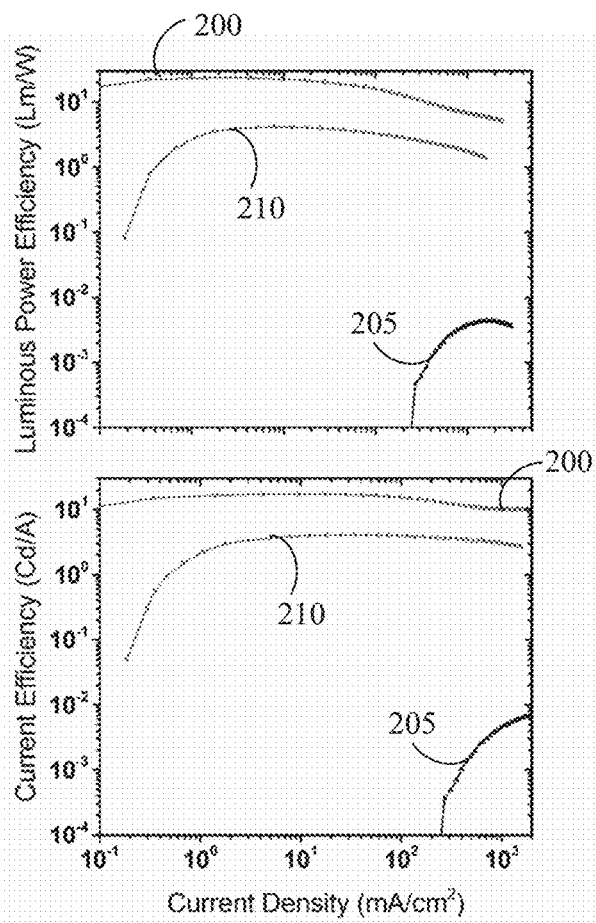
FIG. 3D

TABLE 1 — 3-(4,5-Dimethylthiazol-2-yl)-2,5-diphenyltetrazolium bromide (MTT) assay results at 24 h.

| Light source | Mean MTT values | | |
|---|---|---|---|
| | HEp-2 | L929 | 3T3 |
| QLED PBM | $0.697 \pm 0.083$ (N = 14) [1,2] | $0.574 \pm 0.062$ (N = 14) | $0.443 \pm 0.182$ (N = 12) |
| QLED control | $0.545 \pm 0.066$ (N = 14) | $0.510 \pm 0.062$ (N = 14) | $0.351 \pm 0.090$ (N = 12) |
| LED PBM | $0.789 \pm 0.032$ (N = 4) [2] | $0.647 \pm 0.021$ (N = 4) [1] | $0.346 \pm 0.036$ (N = 4) [1] |
| LED control | $0.668 \pm 0.033$ (N = 4) | $0.499 \pm 0.033$ (N = 4) | $0.273 \pm 0.050$ (N = 4) |

[1] $p = 0.05$.
[2] $p = 0.002$.
[3] $p = 0.0003$.
[4] $p = 0.0004$ versus control.
Note: $p$ is a value used to assess if the experimental outcome is distinct from the control. Smaller $p$ value (<0.05) indicates significant difference.

FIG. 6

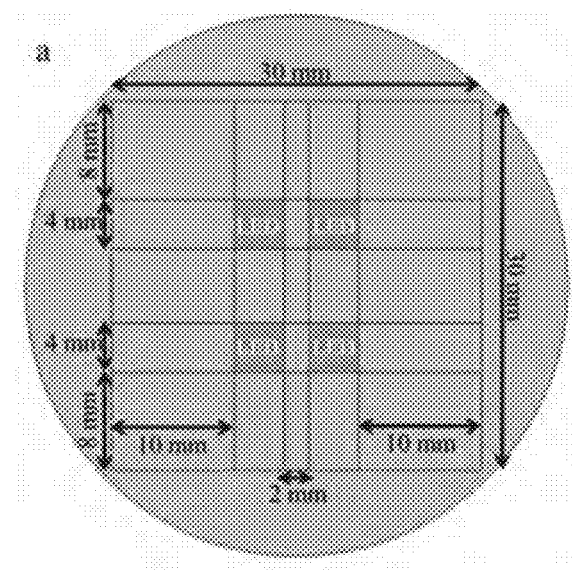
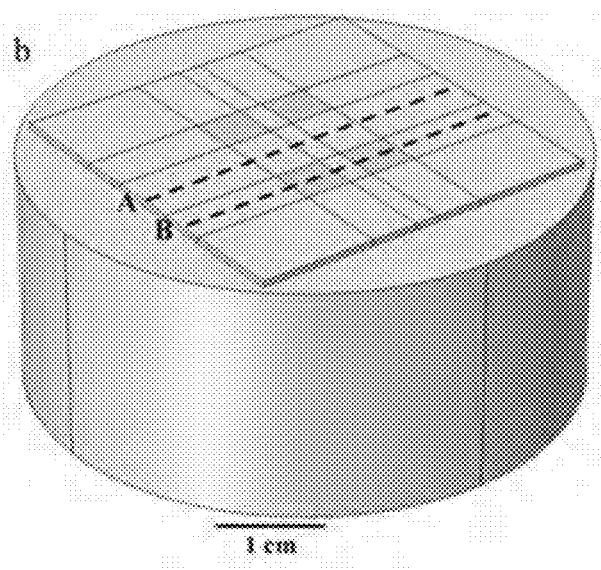
FIG. 9A
FIG. 9B
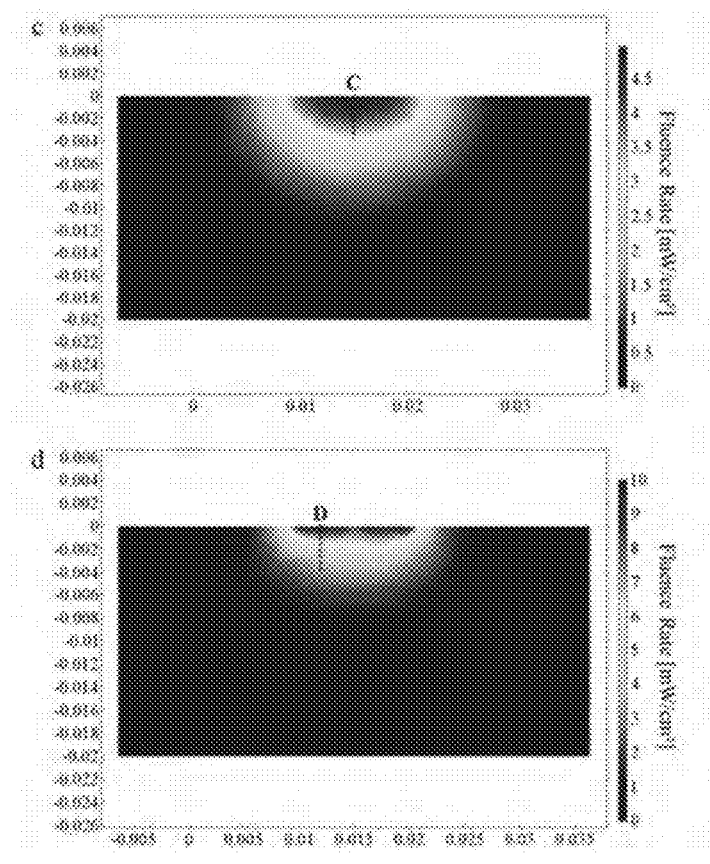
FIG. 9C
FIG. 9D

QUANTUM DOT LIGHT EMITTING DEVICES (QLEDS) AND METHOD OF MANUFACTURE

CROSS-REFERENCE TO RELATED APPLICATIONS

This application claims priority to U.S. Provisional Patent No. 62/565,253, entitled, "Ultrabright Quantum Dot Light Emitting Devices (QLEDs) and Method of Manufacture", filed Sep. 29, 2017, which is incorporated here by reference in its entirety.

BACKGROUND OF THE INVENTION

Colloidal quantum dots (QDs) are superior to organic luminescent materials for display and lighting applications due to their narrow emission bandwidths, high photoluminescence quantum efficiency and tenability of their emission spectrum through particle size control. However, despite year of intense research, quantum dot light-emitting diode (QLED) devices that utilize electroluminescence properties of QDs have remained inferior to organic light-emitting diode (OLED) devices in terms of brightness, efficiency, and operational lifetime prior to this invention.

Photomedical applications include photodynamic therapy (PDT) and photobiomodulation (PBM). In PDT, light of specific wavelengths is used to excite photosensitizers (i.e., drugs that are nontoxic themselves, but can be activated by light exposure) and to turn molecular oxygen into singlet oxygen that can kill unwanted tissues, cells (including cancer cells, bacteria, fungi and viruses) and thus lead to the treatment of cancers, infections, etc. In PBM, light can enhance cellular function, leading to beneficial clinical effects, such as wound repair or hair regrowth.

PDT and PBM have been clinically demonstrated as effective, minimally invasive or noninvasive strategies for treating cancer and other infections, for improving wound repair, for reducing pain and for hair regrowth. However, they have not received widespread acceptance mainly because of the challenging light source requirements, wherein the ideal light source needs to emit the appropriate color within a narrow emission spectrum to match the absorption peaks of the photosensitizers, needs to exhibit a high enough power density for sufficient excitation but also produce low enough heat to avoid pain for the patients in addition to providing flexible form factors with homogeneous emission so that the light source can be easily applied to the patients without worrying about over or under treatments.

Currently, laser and light-emitting diodes (LEDs) are the dominant light sources used in the field of photomedicine because they can provide adequate power density at the proper wavelength window. However, these expensive, hot, rigid, heavy and inhomogeneous light sources are not commonly available in small clinics and treatments can only be carried out in limited places and require expensive hospital visits, thereby limiting their further penetration into practical clinical use.

Organic light-emitting diodes (OLEDs) have previously been proposed for use in photomedicine. However, existing OLEDs are unable to achieve the required high light brightness (>20,000 $cd/m^2$ or ~10 $mW/cm^2$) at wavelengths within the deep red region due to the significant efficiency roll-off problems of OLEDs at high current density and the lack of efficient deep red emitters having narrow spectra.

Accordingly, what is needed in the art is a quantum dot light-emitting (QLED) device having improved efficiency and exhibiting high driving conditions capable of achieving brightness level>100,000 $cd/m^2$. Such improved QLED devices can be applied in the field of photomedicine.

SUMMARY OF THE INVENTION

In various embodiments of the present invention, methods of making ultrabright quantum dot light emitting devices (QLEDs) are provided. In general, the inventive methods comprise depositing a layer of quantum dots (QD) to function as emitters and a layer comprising a mixture of metal oxide nanoparticles and alkali metal compounds to provide for the simultaneous electron injection and hole blocking to achieve charge balance at high driving current density conditions, thus providing an ultrahigh brightness QLED which is 2 to 3 times higher than the maximum brightness of previous QLED or OLEDs of similar color.

In one embodiment, the present invention provides a quantum dot light-emitting diode (QLED) which includes, a quantum dot (QD) light-emitting layer comprising a plurality of quantum dots (QDs) and an electron injection and hole blocking layer comprising a mixture of a plurality of metal oxide nanoparticles and an alkali metal compound, wherein the electron injection and hole blocking layer is adjacent to the QD light-emitting layer.

In additional embodiment, the QLED further includes, a substrate and a cathode layer adjacent to the substrate, wherein the electron injection and hole blocking layer is positioned between the cathode layer and the QD light-emitting layer. The QLED further includes, a hole transport layer adjacent to the QD light-emitting layer, a hole injection layer adjacent to the hole transport layer and an anode layer adjacent to the hole injection layer.

In a particular embodiment, the QD light emitting layer may have a thickness between about 10 nm and about 25 nm. In another embodiment, the QD light emitting layer may be a monolayer, wherein a single layer of light emitting QDs is simultaneously in contact with the hole transport layer and the electron injection and hole blocking layer. In a specific embodiment, the quantum dots may be cadmium selenide (CdSe)-zinc sulfate (ZnS)-cadmium zinc sulfide (CdZnS) core-shell-shell quantum dots.

In another particular embodiment, the metal oxide nanoparticles of the electron injection and hole blocking layer may be zinc oxide (ZnO) nanoparticles and the alkali metal compound may be cesium carbonate ($Cs_2CO_3$).

The QLED may additionally be encapsulated in a barrier layer to form a QLED device that may be used in photomedicine and photobiomedicine applications.

A method of fabricating a quantum dot light-emitting diode (QLED) device in accordance with the present invention may include, fabricating a cathode layer on a substrate, fabricating an electron injection and hole blocking layer comprising a mixture of a plurality of metal oxide nanoparticles and an alkali metal compound onto the cathode layer, fabricating a quantum dot (QD) light-emitting layer comprising a plurality of quantum dots (QDs) on the electron injection and hole blocking layer, fabricating a hole transport layer on the QD light-emitting layer, fabricating a hole injection layer on the hole transport layer and fabricating an anode layer on the hole injection layer.

The method may further include, preparing the mixture for the electron injection and hole blocking layer using zinc oxide (ZnO) nanoparticles and cesium carbonate ($Cs_2CO_3$) and wherein a ratio of ZnO to $Cs_2CO_3$ is between 8:1 and 1:8. Additionally, the method may include, preparing the mixture using zinc oxide (ZnO) nanoparticles and cesium carbonate ($Cs_2CO_3$) dissolved in a polar solvent, wherein a concentration of ZnO and $Cs_2CO_3$ in the solvent is between about 3 mg/ml and about 40 mg/ml.

QLEDs made by the methods described herein achieve performances that surpass QLED devices known in the art by exhibiting high peak current efficiency (>17.5 Cd/A), small efficiency roll-off at high driving current density and high operational stability. The ultra-high brightness of >220,000 $Cd/m^2$ that can be achieved with the QLED of the present invention is believed to be a record luminance for existing red light emitting devices utilizing organic materials.

These and other features, aspects, and advantages of the present invention will become better understood with regard to the following description, appended claims, and accompanying figures.

BRIEF DESCRIPTION OF THE DRAWINGS

The following drawings form part of the present specification and are included to further demonstrate certain embodiments of the present invention. The invention may be better understood by reference to one or more of these drawings in combination with the detailed description of specific embodiments presented herein.

FIG. 3A illustrates a plot of the luminance vs. driving voltage of inverted QLEDs of the present invention in comparison to devices having a ZnO electron injection layer only and a $Cs_2CO_3$ hole blocking layer only.

FIG. 3B illustrates a plot of the current density vs. driving voltage of inverted QLEDs of the present invention in comparison to devices having a ZnO electron injection layer only and a $Cs_2CO_3$ hole blocking layer only.

FIG. 3C illustrates a plot of the luminous power efficiency vs. current driving density of inverted QLEDs of the present invention in comparison to devices having a ZnO electron injection layer only and a $Cs_2CO_3$ hole blocking layer only.

FIG. 3D illustrates a plot of the current efficiency vs. current driving density of inverted QLEDs of the present invention in comparison to devices having a ZnO electron injection layer only and a $Cs_2CO_3$ hole blocking layer only.

FIG. 6 is a table showing the assay results of the photomedical experiments performed.

FIG. 9A illustrates a top-down view of a tissue mimicking geometry irradiated with 630-nm light wavelength delivered from a QLED.

FIG. 9B illustrates a side view of a tissue mimicking geometry irradiated with 630-nm light wavelength delivered from a QLED.

FIG. 9C is a computer simulation showing the resulting fluence rate (mW/cm2) along one cross section of the phantom (line A from FIG. 9b).

FIG. 9D is a computer simulation showing the resulting fluence rate (mW/cm2) along one cross section of the phantom (line B from FIG. 9b).

DETAILED DESCRIPTION OF THE INVENTION

Figure 1:
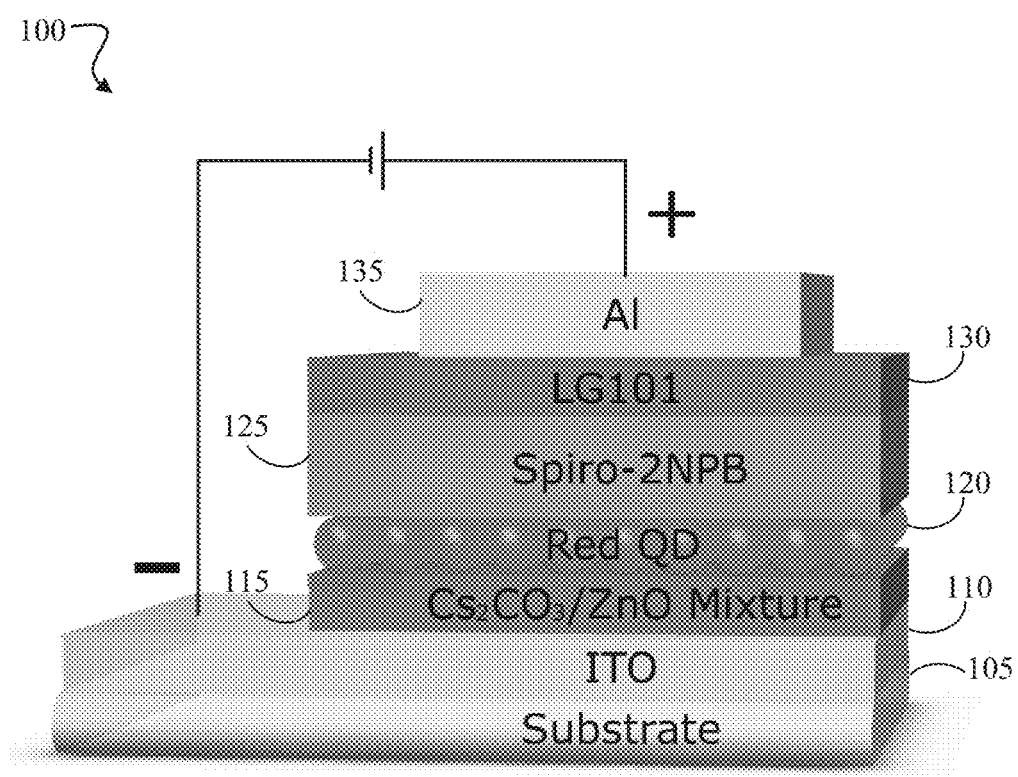
FIG. 1 is a schematic illustration of the structure of an exemplary QLED with a mixture layer of metal oxide nanoparticles and alkali metal compounds for simultaneous electron injection and hole blocking, in accordance with an embodiment of the present invention.

In the following description, for the purposes of explanation, numerous specific details are set forth in order to provide a thorough understanding of the present invention. It will be apparent, however, to one skilled in the art that the present invention may be practiced without these specific details. In order that the invention may be readily understood and put into practical effect, preferred embodiments will now be described by way of the following non-limiting examples.

In various embodiment, methods of making ultrabright quantum dot light-emitting devices (QLEDs) are provided. In general, the methods comprise depositing quantum dot (QD) layers to function as emitters and a mixture layer of metal oxide nanoparticles and alkali metal compounds for the simultaneous electron injection and hole blocking to achieve charging balance at high driving current conditions, and thus ultrahigh brightness which is at least 2 to 3 times higher than maximum brightness of previous QLED or OLEDs of similar color.

It has been reported that QLEDs with a metal oxide (ZnO or $TiO_2$) nanoparticle electron injection layer can exhibit peak efficiencies approaching those of state-of-the-art OLEDs. However, the efficiencies of those QLEDs showed a strong dependence on the thickness of the QD layers and the driving current levels. High device efficiencies (>10 Cd/A) have been achieved with a thick QD layer (>45 nm) at relatively low current density (<100 $mA/cm^2$), but significant efficiency roll-off has been observed when these devices were pumped to higher current levels. Similar behavior has been previously reported for both fluorescent and phosphorescent OLEDs, and has been a long-standing problem for their applications in displays, solid state lighting or photomedicine, as it limits their power efficiency at high current density and their maximum brightness level. In addition, these high efficiency QLEDs with thick QD layers showed poor operational stability, most likely because the thick highly resistive QD layer resulted in poor charge balance of electrons and holes.

It is known in the art to add an interlayer of an alkali metal compound (such as $Cs_2CO_3$) between the light emitting quantum dots and the electron injecting ZnO nanoparticles of a QLED. This interlayer effectively blocks the overflow of hole current from the ZnO layer that otherwise passes through and gets lost in the thin quantum dot layer, thereby improving the conductivity of the QLED. However, the effect of $Cs_2CO_3$ in the prior art was considered "interfacial", and as such, the common practice is to insert the alkali metal compound layer between the ZnO layer and the quantum dot layer as a barrier to diffusion from the ZnO layer into the quantum dot layer.

Instead of positioning the alkali metal compound as an independent layer between the ZnO layer and the quantum dot layer, as is commonly known in the art, in the present invention a mixture of the alkali metal compound and the metal oxide nanoparticles is first formed and then applied as a single layer in the QLED device. Since it was known in the art that the purpose of the alkali metal layer is to provide a barrier between the metal oxide nanoparticle layer and the quantum dot layer, one of ordinary skill in the art would not expect that combining the alkali metal compound and the metal oxide nanoparticle layer into a mixture and applying them as one layer would preserve the functionality of the alkali metal layer as a barrier layer between the metal oxide nanoparticle layer and the quantum dot layer.

An additional advantage of the alkali metal compound and the metal oxide nanoparticle mixture layer is that the mixing allows better tunability of the QLED, by changing the ratio of ZnO to $Cs_2CO_3$. This is in contrast with a QLED device fabricated with individual alkali metal and metal oxide nanoparticle layers, where the tuning is fixed. Better tunability results in improved optimization of QLED performance.

FIG. 1 shows a QLED structure 100 according to an embodiment of the present invention incorporating an electron injection and hole blocking layer 115 comprising a mixture of nanoparticles of metal oxide (ZnO as a typical example) and alkali metal compounds ($Cs_2CO_3$ as a typical example) for simultaneous electron injection and hole blocking to achieve charge balance at high driving current conditions. In this particular embodiment, CdSe—ZnS—CdZnS core-shell-shell QDs are used as QD emitters in the QD layer 120, 2,2',7,7'-tetrakis[N-naphthalenyl(phenyl)-amino]-9,9-spirobifluorene (spiro-2NPB) is used as the hole transport layer 125 and LG 101 from LG is used as LG101 the hole injection layer 130. The device 100 further includes a substrate 105, an indium tin oxide (ITO) cathode 110 and an aluminum anode 135.

In various embodiments, the metal oxide nanoparticles of the electron injection and hole blocking layer 115 may be selected from: ZnO; $TiO_2$; $ZrO_2$; $SnO_2$; $WO_3$; $Ta_2O_3$ or any combination thereof. Additionally, the alkali metal compounds of the electron injection and hole blocking layer 115 may be selected from: $Li_2CO_3$; $Cs_2CO_3$; Cesium stearate; 8-Hydroxyquinolinolatolithium (Liq) or any combination thereof.

The mixing of the metal oxide nanoparticles and the alkali metal compound in the electron injection and hole blocking layer 115 can be optimized at different ratios (e.g. 1:1, 1:2, 1:4, 2:1, 4:1 etc) for ideal electron injection and hole blocking effects. The deposition of the mixture layer 115 may be carried out by various solution processes including, but not limited, to spin coating, drop casting, slot die coating, spray coating, electrospray coating, electro-hydro-dynamic printing, screen printing, aerosol jet, roll-to-roll (R2R) or ink jet printing. The processing conditions, such as temperature, pressure and gas environments can also be varied for optimal film smoothness.

Nanoparticles of metal oxides, such as ZnO and $TiO_2$, can be synthesized by a number of techniques including hot solutions, colloidal solutions or sol-gel methods. In a typical colloidal solution synthesis process for ZnO nanoparticles, Zinc acetate dihydrate (3.00 g, 13.7 mmol) and 2-methoxy-ethanol (200 mL) are added to a flask equipped with a magnetic stirbar. In a separate vial, TMAH (4.5 g, 25 mmol) and 2-methoxyethanol (20 mL) are combined. Both solutions are then agitated vigorously until the reagents are dissolved. Under constant stirring, the TMAH solution is slowly added to the zinc acetate solution over 10 min. The solution is then allowed to stir for an additional 1 min resulting in the demonstration of a pale blue-green emission when excited with UV light. 2-Ethanolamine (4 mL) is then added to stabilize the particles. The ZnO nanocrystals are then purified by adding toluene (440 mL) and hexanes (220 mL) to the above mixture. The flocculates are isolated by centrifugation (3500 rpm; 1 min) and decanting of the colorless supernatant is then performed. The colorless powder is then redispersed in a mixture of 2-isopropanol (44 mL) and methanol (11 L) and filtered through a syringe filter (0.2 µm). The nanoparticles often have a mean characteristic diameter of less than approximately 20 nm, and preferably less than 5 nm. Solution-processable ZnO nanoparticle films have proven to be an effective electron injection and transporting layer for organic-inorganic hybrid light emitting devices and QLEDs of both forward (in which the anode is processed first on the substrate) and inverted (in which the cathode is processed first on the substrate) structures due to their native n-type doping, high film smoothness/uniformity and film robustness upon further solution processing. However, ZnO nanoparticles alone can't provide hole blocking function in completed devices.

Alkali metal compound solutions can be prepared by dissolving their powders (such as $Li_2CO_3$ and $Cs_2CO_3$) in various solvents such as water, methanol, isopropanol, ethanol, 2-methoxyethanol etc. In a typical $Cs_2CO_3$ solution preparation process, 7 mg of $Cs_2CO_3$ powders can be dissolved in 2-methoxyethanol to get 1 ml of $Cs_2CO_3$ solution of a concentration of 7 mg/ml. $Cs_2CO_3$ is a material commonly used in organic optoelectronics (e. g. OLED, Polymer light emitting device, PLED and organic photovoltaic, OPV) on the cathode side for several reasons: 1) It can form a low work function surface facilitating electron injection while blocking holes due to its wide bandgap, 2) It is the most stable alkali carbonate, as the stability of the carbonates increases going down the element group, 3) It can be processed with either thermal evaporation or solution processing techniques that result in almost identical film quality, 4) It has a high solubility in polar solvents such as water and most alcohols, and is almost completely insoluble in most other organic solvents such as toluene, p-xylene, and chlorobenzene.

The mixture of metal oxide nanoparticles and alkali metal compound solutions can be prepared by combining the solutions prepared in the above-mentioned method in different ratios. For example, $ZnO/Cs_2CO_3$ ratio could range from 8:1 to 1:8 to provide a different performance for different materials and different applications. Also, the solvent for the $ZnO/Cs_2CO_3$ could be any polar solvent (for example, methanol, isopropanol, ethanol, 2-methoxyethanol etc.) or mixture of these polar solvents. Concentration for the $ZnO/Cs_2CO_3$ could change from about 3 mg/ml to about 40 mg/ml to obtain films with different thickness.

The mixture solution of metal oxide nanoparticles and alkali metal compound solutions 115 can be processed onto a cathode contact layer 110 on a transparent substrate 105, which may be glass or a polymer. The cathode contact layer 110 may be, but is not limited to, doped or undoped oxides including indium tin oxide (ITO), $F:SnO_2$ (FTO), indium zinc oxide (IZO), Al:ZnO, indium copper oxide (ICO), Cd:ZnO, $SnO_2$, $In_2O_3$, but may additionally be metallic layers including nickel (Ni), platinum (Pt), gold (Au), silver (Ag) film or nanowires, or mixed carbon nanotubes or graphene. The cathode layer 115 can be a continuous film or it can be constructed of microwires or nanowires which may be distributed in a patterned or random manner. The process for the mixture of metal oxide nanoparticles and alkali metal compound solutions, with a mixture solution temperature ranging from 25° C.-150° C., can include, but is not limited to, spin coating, drop casting, slot die coating, spray coating, electrospray coating, electro-hydrodynamic printing, screen printing, aerosol jet, roll-to-roll (R2R) or ink jet printing, followed by removal of the suspending solvent to leave the metal oxide nanoparticles and alkali metal compound layer, with or without thermal annealing. The suspending solvent can be an organic liquid, water, or a combination of such liquids. The thickness of this mixture can be of less than 5 nm to about 100 nm.

Quantum dots for the active layer 120 of the QLED may be synthesized by a number of techniques including hot injection or colloidal solution methods. In various embodiments, the quantum dots (QDs) of the QD layers 120 may be selected from: Group II-IV compound semiconductor nanocrystals such as CdS, CdSe, CdTe, ZnS, ZnSe, ZnTe, HgS, HgSe, HgTe or any combination thereof; Group III-V or IV-VI compound semiconductor nanocrystals such as GaP, GaAs, GaSb, InP, InAs and InSb; PbS, PbSe, PbTe or any combination thereof; $CuInSe_2$ nanocrystals; core-shell or core-shell-shell structured nanocrystals such as CdSe/ZnSe, CdSe/CdS, CdSe/ZnS, CdS/ZnSe, CdS/ZnS, ZnSe/ZnS, InP/ZnS, CdSe/ZnSe/ZnS, CdSe/ZnS/CdZnS, CdSe/ZnSe/CdZnS, InP/ZnSe/ZnS, InP/ZnS/ZnSe or any combination thereof. In an exemplary embodiment, CdSe—ZnS—CdZnS core-shell-shell QDs can be used to take advantage of their narrow spectrum bandwidth and high (~100%) photoluminescence external quantum efficiency (EQE). The quantum dot light-emitting layer 120 preferably has a thickness of about 10 nm to about 25 nm and is preferably carefully controlled down to one monolayer, as having a single QD to make direct contact with both the hole transport layer and the electron injection and hole blocking layer is believed to be advantage to avoid the over accumulation of either carrier at certain interfaces, thus achieving improved charge balance.

The QD solution can be deposited on the aforementioned mixture layer 115 by spin coating, drop casting, slot die coating, spray coating, electrospray coating, electro-hydrodynamic printing, screen printing, aerosol jet, roll-to-roll (R2R) or ink jet printing, followed by thermal annealing to remove the suspending solvent, thereby resulting in the active layer of the QLED. The suspending solvent can be one of a variety of nonpolar organics including, but not limited to, hexane, octane, decane, toluene, and chlorobenzene. In a typical example, low vapor pressure (1.6 kPa) chlorobenzene may be selected as the solvent for QDs because it has been found to be effective in reducing "coffee ring" formation that can give rise to significant QD layer surface roughness and thickness variation in solution-processed features.

In one embodiment, after the QD layer 120 deposition, an optional small molecule (e.g., water) treatment process can be applied. In a typical embodiment, all samples are transferred to a water treatment chamber and saturated water vapor in nitrogen carrier gas is transported through the chamber for 15 minutes under blue light shining to treat the QD surface. Small molecules, like water, have been found to play a positive role in the photoinduced fluorescence enhancement (PFE) behavior of certain QDs (for example CdSe/ZnS core/shell QDs). The water exposure is speculated to have a stabilization effect on the highly emissive surface trap state of the QD shell. It has been reported that up to 500% luminance increase can be obtained by exposing the whole forward structure QLED device stack to humid air during the first 2 hours of a lifetime test. This treatment process, although effective, could have long-term negative effects for the exposed organic components in the devices, limiting their operational stability. In the inverted structure QLEDs, it has been found that exposing the certain QD layer to water vapor can have a dramatic effect to performance of the resulting QLED. In some cases, the treated QLEDs can have at least double luminance efficiency and operational lifetime compared to untreated control QLED devices that were fabricated and tested with otherwise identical conditions. Because the water treatment was carried out on the QD layer only before deposition of any organic materials, the detrimental effects of water to organics are expected to be minimized.

In certain embodiments, the QLEDs also include a hole injection layer 130 and a hole transport layer 125 that could be polymer or small molecules including, but not limited to 2,2',7,7'-tetrakis[N-naphthalenyl(phenyl)-amino]-9,9-spirobifluorene (spiro-2NPB), LG 101, poly(spiro-fluorene), Poly [N,N'-bis(4-butylphenyl)-N,N-bis(phenyl)-benzidine] (Poly-TPD), tris(3-methylphenylphenylamino) triphenylamine (m-MTDATA), poly(9,9'-dioctylfluorene-co-N-(4-butylphenyl) diphenylamine (TFB), poly[2-methoxy-5-(2'-ethylhexyloxy)-1,4-phenylene vinylene] (MEH-PPV) and poly[2-methoxy-5-(3',7'-dimethyloctyloxy)-1,4-phenylene vinylene] (MDMO-PPV), Dipyrazino[2,3-f:2',3'-h] quinoxaline-2,3,6,7,10,11-hexacarbonitrile (HATCN) or any combination thereof.

The deposition of the hole transport layer 125 and/or the hole injection layer 130 may be carried out by dry processes including, but not limited to thermal evaporation, Ebeam evaporation, sputtering or organic vapor phase deposition. Alternatively, some of these organic layers can also be solution processed by various solution processes including, but not limited to spin coating, drop casting, slot die coating, spray coating, electrospray coating, electro-hydrodynamic printing, screen printing, aerosol jet, roll-to-roll (R2R) or ink jet printing. The processing conditions, such as temperature, pressure and gas environments can also be varied for optimal film smoothness.

Following the application of all the layers of the QLED, the samples may then be transported to the vacuum deposition chamber and pumped down to $1$-$5 \times 10^{-7}$ torr for evaporation of subsequent device layers including the hole transport layer 125, the hole injection layer 130 and the top anode layer 135 to complete the inverted device stack. In a typical embodiment, a 65 nm layer of hole transport material spiro-2NPB (2,2',7,7'-tetrakis[N-naphthalenyl(phenyl)-amino]-9,9-spirobifluorene) is then evaporated onto the emissive layer in a deposition chamber, followed by a 15 nm hole injection layer (LG-101 available from LG Chemical) and 100 nm layer of Aluminum metal contact. In contrast to traditional forward structure OLEDs, the inverted architecture provides a reverse injection scheme in which holes are injected from a top anode 135 and electrons are injected from a bottom cathode 110. The bottom cathode 135 makes inverted QLEDs better suited for integration with low cost, n-type thin film transistor (TFT) driving electronics used in active matrix displays.

Other embodiments as alternatives could be: an organic polymer comprising hole transport layer 125 and an organic polymer comprising hole injection layer 130 can be employed in the device, such as TPD, NPB, tris(3-methyl-phenylphenylamino) triphenylamine (m-MTDATA), poly(9,9'-dioctylfluorene-co-N-(4-butylphenyl) diphenylamine (TFB), poly[2-methoxy-5-(2'-ethylhexyloxy)-1,4-phenylene vinylene] (MEH-PPV) and poly[2-methoxy-5-(3',7'-dimethyloctyloxy)-1,4-phenylene vinylene] (MDMO-PPV), poly (3,4-ethylenedioxythiophene) polystyrene sulfonate (PEDOT:PSS) or any of the above mentioned polymer doped with tetrafluoro-tetracyanoquinodimethane (F4-TCNQ). The thickness of the hole transport layer 125 and the hole injection layer 130 may be about 10 nm to about 200 nm. The hole injection layer 130 and the hole transport layer 125 may be deposited on the QD light emitting layer 120 by a fluid based method such as spin coating, printing, casting and spraying a solution or suspension of the material followed by removal of the suspending vehicle, generally an organic liquid, or a mixture of liquids that won't dissolve the layers underneath and can be evaporated or otherwise removed from the material to be deposited to form the layer.

The anode 135, according to various embodiments of the invention, may be ITO, or thin metallic layers including nickel (Ni), platinum (Pt), gold (Au), silver (Ag) film or nanowires, or mixed carbon nanotubes or graphene. The anode film 135 may range in thickness from about 50 nm to about 300 nm.

In one embodiment, the fabricated QLED device 100 may be encapsulated using a glass cover plate with ultraviolet-curable epoxy and oxygen/moisture getter material before being removed from the glovebox to ambient conditions for testing. The encapsulation can also be carried out with thin films prepared by chemical vapor deposition or atomic layer deposition.

To illustrate the cooperative nature of the metal oxide (ZnO) nanoparticles and alkali metal compounds ($Cs_2CO_3$), two control devices (one with only ZnO electron injection layer, while the other with only $Cs_2CO_3$ hole blocking layer) that have identical QDs and hole transport/injection layers were also fabricated and tested to show the baseline performance.

Figure 2:
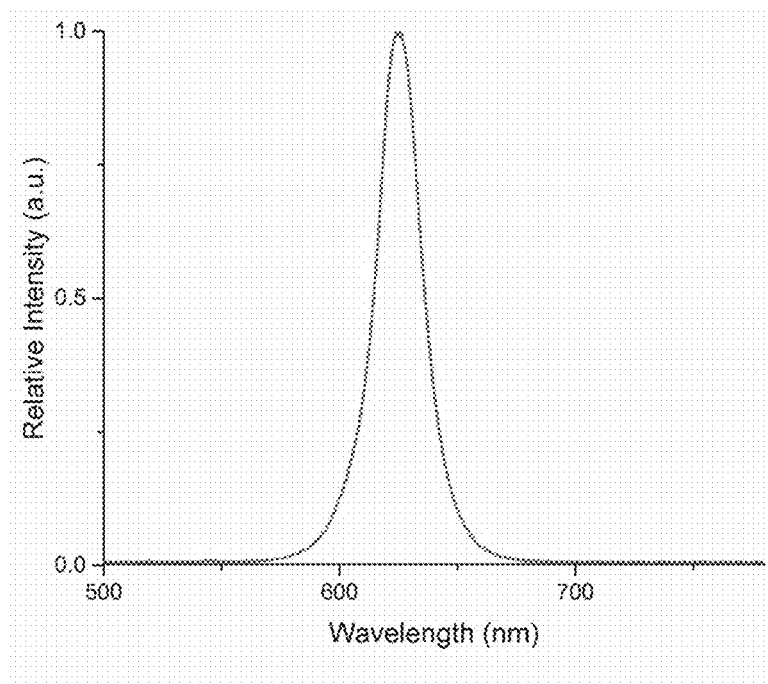
FIG. 2 illustrates the electroluminescence spectra for a red QD-LED based on the design of FIG. 1, in accordance with an embodiment of the present invention.

FIG. 2 illustrates the electroluminescence spectrum of one exemplary ultrabright red QLED with a saturated (FWHM of 21.5 nm with a peak wavelength of 626 nm) quantum dot emission profile. The 1931 Commission Internationale de l'éclairage (CIE) x-y coordinates of the QLEDs are (0.69, 0.31), falling into the deep red range, a region favorable for wide color gamut OLED operations, but usually more difficult to improve than light red because of the energy gap law. Changing the QDs layers to a different color, while keeping all other layers the same, will lead to QLEDs of different colors.

FIG. 3A-FIG. 3D illustrate the current-density/luminance/voltage (J-L-V) characteristics of the $ZnO/Cs_2CO_3$ based device 200 and the two control devices with either ZnO nanoparticles 205 or $Cs_2CO_3$ interlayer 210 only on the cathode side. FIG. 3A illustrates a plot of the luminance vs. driving voltage of inverted QLEDs of the present invention 200 in comparison to devices having a ZnO electron injection layer only 205 and a $Cs_2CO_3$ hole blocking layer only 210. FIG. 3B illustrates a plot of the current density vs. driving voltage of inverted QLEDs of the present invention 200 in comparison to devices having a ZnO electron injection layer only 205 and a $Cs_2CO_3$ hole blocking layer only 210. FIG. 3C illustrates a plot of the luminous power efficiency vs. current driving density of inverted QLEDs of the present invention 200 in comparison to devices having a ZnO electron injection layer only 205 and a $Cs_2CO_3$ hole blocking layer only 210. FIG. 3D illustrates a plot of the current efficiency vs. current driving density of inverted QLEDs of the present invention 200 in comparison to devices having a ZnO electron injection layer only 205 and a $Cs_2CO_3$ hole blocking layer only 210.

As shown in FIG. 3A, the device with only the ZnO nanoparticle electron injection layer 205 shows a threshold voltage ($V_{th}$) of around ~1.2 V (where $V_{th}$ is defined as the onset of increased device current density), and reaches the current density (2000 mA/cm$^2$) at a driving voltage as low as 5 V. Meanwhile, the luminance is rather weak despite the early current onset. As a result, the efficiencies, as shown in FIG. 3B, are relatively low (current efficiency<0.1 Cd/A, while luminous power efficiency<0.1 lm/W in the testing range). This behavior agrees with observations in previous QD layer thickness dependence studies, indicating a significant leakage of hole current because (1) a monolayer of QDs does not provide full coverage of the ZnO surface, leaving voids that act as hole current leakage pathways and (2) ZnO nanoparticles alone are insufficient to block these holes. The device with only the $Cs_2CO_3$ interlayer 210 shows turn on voltage of 2.2 V and much lower current density and limited efficiency. Significantly, when the mixture layer of electron injection ZnO nanoparticles and hole blocking $Cs_2CO_3$ was employed, the device exhibited improved charge balancing along with several other enhanced performance features. First, compared to ZnO-only device, the threshold voltage of $ZnO/Cs_2CO_3$ device was shifted to ~1.8 V, indicating minimal leakage current, as expected from the hole blocking effect of the $Cs_2CO_3$ interlayer (FIG. 3A). Secondly, along with the current density increase, the current efficiency shows steady increase to peak levels (17.4 Cd/A at ~2,000 Cd/m$^2$ with a driving voltage of only 2.5 V). The low driving voltages of the devices indicate high luminous power efficiency (with a peak level of 23.6 Lm/W) and low power consumption. These peak efficiencies correspond to an external quantum efficiency of ~17%. Lastly, and most importantly, the device only has a small efficiency roll off (down to 10 Cd/A) when pumping to a high current density level of 2350 mA/cm$^2$ with a driving voltage of only 6 V. The high luminous efficiency at high current densities results in a record high, red luminance (230,000 Cd/m$^2$ at 2350 mA/cm$^2$ and 6 V) which, to the best of our knowledge, is the highest for all organic-related light-emitting devices, at least twice the peak luminance of the best reported thermally evaporated red OLEDs. It is believed that this low efficiency roll-off feature is a result of improved electron and hole balancing in the inventive device structures combined with the high-quality quantum dot materials with close to unity EQE.

The major innovation of this invention is using a mixture of metal oxide (e.g. ZnO) nanoparticles and alkali metal compounds (e.g. $Cs_2CO_3$) for simultaneous electron injection and hole blocking. With a ZnO layer only, as the QD layer is just one monolayer thick, a large amount of hole current can easily pass through it, leading to high leakage of charge carriers. When the ZnO/$Cs_2CO_3$ mixture layer was employed, ZnO can accommodate the electron injection from nanoparticles to QDs, while $Cs_2CO_3$ can effectively block the leakage holes. Efficient electron-hole recombination occurs at the QD/$Cs_2CO_3$ interface, resulting in high efficiency and high brightness at low driving voltage.

In a particular embodiment, the novel QLED of the present invention is particularly well suited to the field of photomedicine. Photomedicine is an emerging medical field, in which light is used either to kill cancer cells with assistance of photosensitizers and singlet oxygen (photodynamic therapy, PDT) or to stimulate cellular function leading to beneficial clinical effects (photobiomodulation, PBM). Because of their unique form factors as thin, flexible, light weight and uniformly large area light sources, organic light emitting devices (OLEDs) were once proposed to work as light-emitting bandages for PDT, but were later abandoned in favor of LEDs, because photomedical applications generally require light sources of relatively high brightness (>20,000 Cd/m$^2$ or ~10 MW/cm$^2$) at wavelengths in the deep red region in order to have deep tissue penetration while still maintaining sufficient energy for molecular excitations. Existing OLEDs with either fluorescent or phosphorescent emitters can't achieve such high brightness at the right wavelength windows because of significant efficiency roll-off problems of OLEDs at high current density and the lack of efficient deep red emitters with narrow spectra.

Figure 4A:
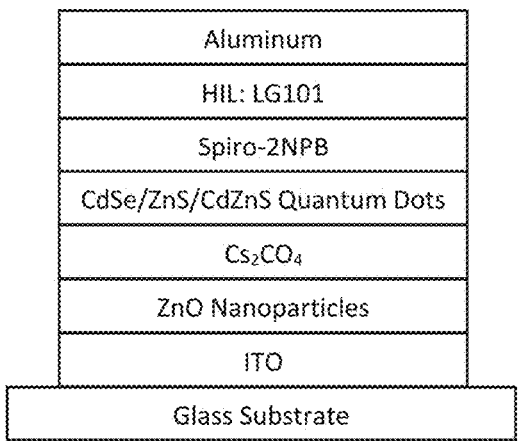
FIG. 4A is a schematic representation of the ultra-bright, high efficiency, inverted QLEDs, in accordance with an embodiment of the invention.
Figure 4B:
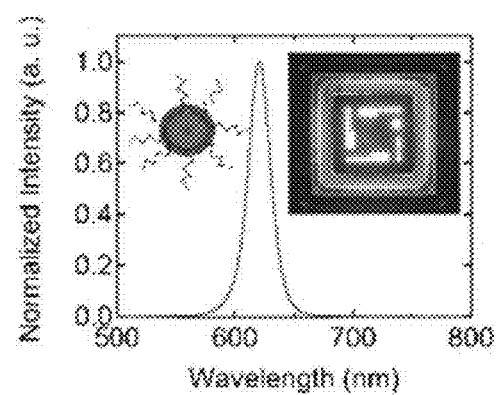
FIG. 4B illustrates a spectrum of the QLED electroluminescence, in accordance with an embodiment of the invention.
Figure 4C:
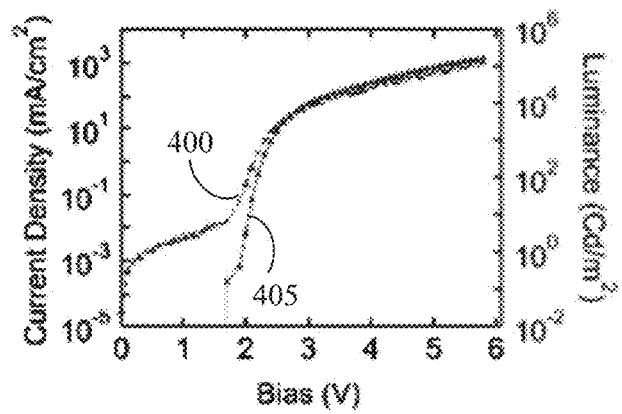
FIG. 4C illustrates the luminance and current density versus driving voltage, in accordance with an embodiment of the invention.
Figure 4D:
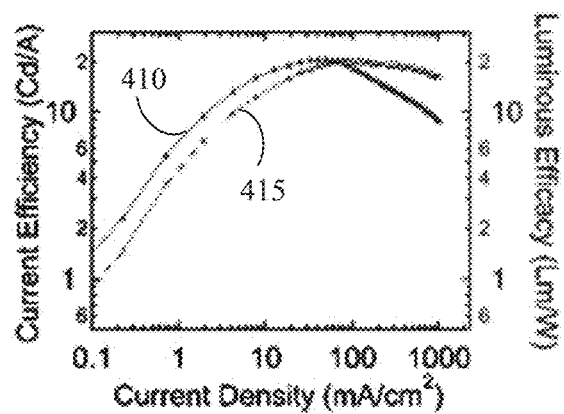
FIG. 4D illustrates luminous efficacy and current efficiency versus driving current density for typical devices, in accordance with an embodiment of the invention.

As shown, with reference to FIG. 4A-FIG. 4D, in an exemplary embodiment of the present invention, a QLED device demonstrates peak emission wavelength of 620 nm, narrow bandwidth of 22 nm and can achieve high current efficiency (20.5 Cd/A at ~20000 Cd/m$^2$) and small efficiency roll-off, at high driving current density. FIG. 4A is a schematic representation of the ultra-bright, high efficiency, inverted QLEDs, in accordance with an embodiment of the invention. FIG. 4B illustrates a spectrum of the QLED electroluminescence. FIG. 4C illustrates the luminance 405 and current density 400 versus driving voltage and FIG. 4D illustrates luminous efficacy 410 and current efficiency 415 versus driving current density for typical devices.

In this exemplary embodiment, ultrahigh brightness of 165,000 cd/m2 can be achieved at current density of 1000 mA/cm2, which sets a new brightness record for existing organic related red light emitting devices. As previously described, the QLED device in accordance with the present invention combines the ZnO and $Cs_2Co_3$ layers into a single layer, thereby resulting in the improved results.

Figure 5A:
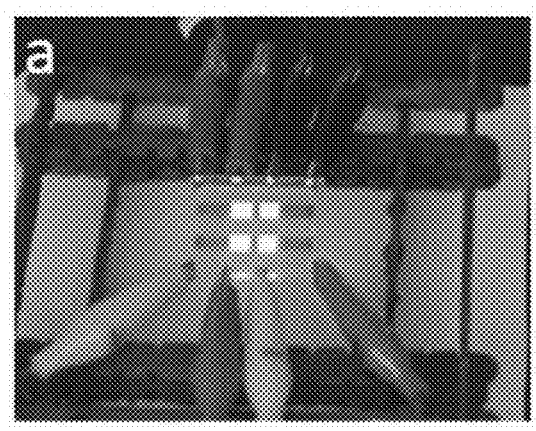
FIG. 5A illustrates a 2×2 red QLED array for performing the photomedical experiment, in accordance with an embodiment of the invention.
Figure 5B:
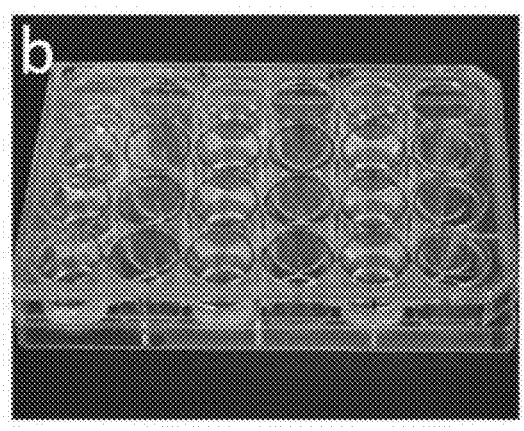
FIG. 5B illustrates the experimental setup for performing the photomedical studies, in accordance with an embodiment of the invention.
Figure 5C:
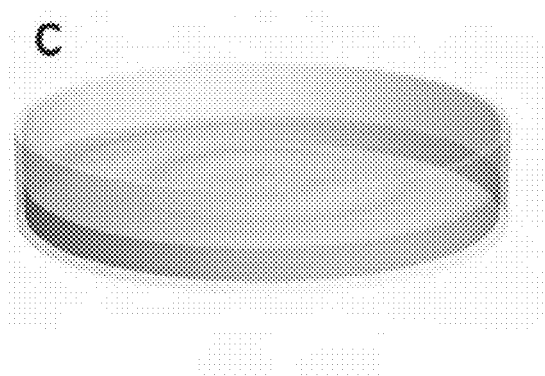
FIG. 5C illustrates the control cell cultures without light treatment for performing the photomedical studies, in accordance with an embodiment of the invention.
Figure 5D:
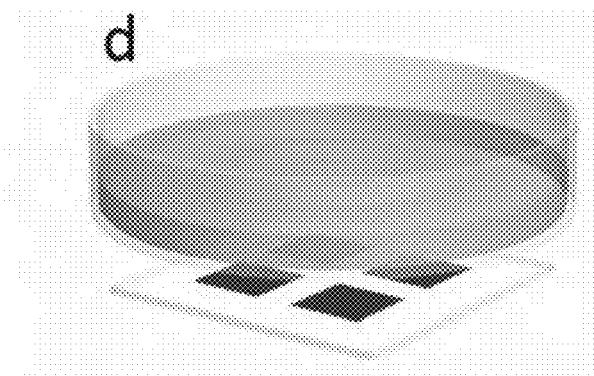
FIG. 5D illustrates the cell cultures using QLED as light source for performing the photomedical studies, in accordance with an embodiment of the invention.

For experimental testing of the photomedical QLEDs, a 4-pixel (4×4 mm each.) QLED array was developed as a photomedical light source. A specialized platform and cradle were built to stabilize the QLED array allowing proper tray positioning underneath cell cultures for in-vitro PBM and PDT experiments. As shown in FIG. 5A, a 2×2 red QLED array was developed, along with the experimental setup shown in FIG. 5B. The control cell cultures without light treatment and the cell cultures using QLED as light source are shown in FIG. 5C and FIG. 5D, respectively. The results are compared with the control cell cultures that received no light treatment or parallel studies with inorganic LED treatment.

In an exemplary embodiment, for PBM testing, three cell lines (HEp-2 [ATCC-CCL-2]; L929 [ATCC-CCL-1], 3T3 [ATCC-CRC-2593]; American Tissue and Cell Culture Collection [ATCC], Manassas, Va.), were cultured in 24-well trays in complete Dulbecco's Modified Eagle Medium supplemented with 10% fetal bovine serum, streptomycin-penicillin-fungicin, glutamine and pyruvate, without phenol red. These cell lines are frequently used for in-vitro studies of PBM and are often used as surrogates for whole animal studies of wound healing, among other applications. HEp-2 cells are a human epithelial cell line derived from cervical cancer and are biologically identical to the famous HeLa cell line. The L929 is a mouse fibroblast cell line, and 3T3 cells are also a fibroblast cell type derived from mouse embryos.

Photoradiation was performed using the inverted ultra-bright QLED to deliver 4.0 J/cm2 to the culture wells during 10-min treatment at power density of ~8 mW/cm$^2$. Control cell cultures received no light treatment. Cell metabolism was assessed by 3-(4,5-dimethylthiazol-2-yl)-2,5-diphenyltetrazolium bromide assay (Chemicon International Inc., Temecula, Calif.) 24 h post treatment. The 3-(4,5-dimethylthiazol-2-yl)-2,5-diphenyltetrazolium bromide assay is a colorimetric assay and is a popular method to evaluate cell metabolic activity. Parallel studies were performed at 670 nm±20 nm using an LED device (Quantum Devices, Barneveld, Wis.) delivering 4.0 J/cm2 during 10-min treatment for comparison with QLED PBM.

Assay results at 24 h, as presented in Table 1 of FIG. 6, show that QLED PBM increased cell metabolism in the HEp-2 cell line and in a similar fashion to a NASA LED source. For HEp-2, L929 and 3T3, QLED PBM increases the cell metabolism by 27.9, 26 and 12.5% over the control systems, respectively. Although the peak wavelength of QLED (~620 nm) is still away from the favorite 660 nm for PBM, the results of QLED BPM are comparable with the LED PBM. Further tuning the emission wavelength of QLED is expected to lead to improved PBM results.

To evaluate the potential of red QLEDs as a light source for PDT, 3D cultures of A431 cells (a human cell line frequently used in cancer-associated biomedical study) were grown on beds of laminin-rich-extracellular matrix and photosensitized by administration of aminolevulinic acid (ALA) leading to accumulation of protoporphyrin IX (PpIX) prior to light activation.

Cultures were treated using either the QLED sources with low average irradiance (approx 1.8 mW/cm$^2$) or a solid-state LED with similar spectral emission but higher irradiance (approx 130 mW/cm$^2$). Dosimetry was controlled so that cultures received the same total light dose of 30 J/cm$^2$ over the course of either 4.75 h (QLED) or 4 min (solid state LED). In the case of QLED irradiations, calibration runs were first performed to measure power drop off during extended continuous operation. Irradiation duration was determined by integration of irradiance over time to determine the time required (4.75 h) for the QLED to deliver the same total light dose as the solid-state LED source (30 J/cm$^2$). Treatment response was evaluated 24 h after PDT using an imaging-based approach described previously.

Figure 7A:
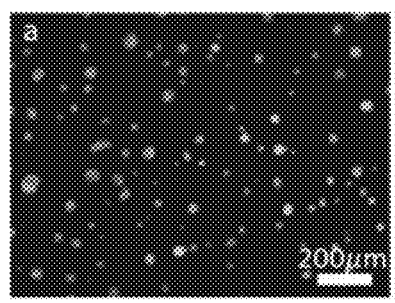
FIG. 7A illustrates the control cells without light treatment for an QLED-based PDT experiment.
Figure 7B:
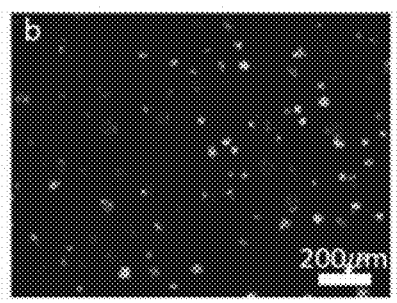
FIG. 7B illustrates the results of an LED-based PDT experiment.
Figure 7C:
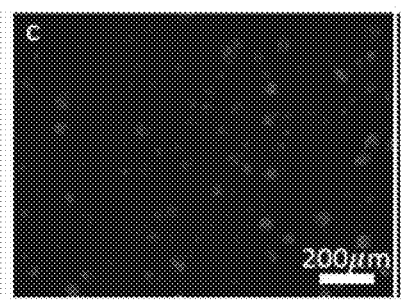
FIG. 7C illustrates the results of the QLED-based PDT experiment.

As shown in FIG. 7A-FIG. 7C, both QLED and LED sources achieve photodestruction of 3D tumor nodules, while quantitative image processing of multiple replicates reveals PDT efficacy is slightly enhanced using the QLED source, with residual tumor viabilities of 0.61+/−0.04 versus 0.53+/−0.08 for the solid state and QLED sources respectively. FIG. 7A-FIG. 7C illustrate the fluorescent vital-dye labeled 3D cultures 24 h post photodynamic therapy (PDT) treatment, wherein calcein labels live cells green while ethidium bromide labels dead cells red. FIG. 7A illustrates the control cells without light treatment. FIG. 7B illustrates the results of LED-based PDT and FIG. 7C illustrates the results of the QLED-based PDT. The results are consistent with previous reports that PDT at low dose rates may be more effective and are significant here in view of the capability of the QLED to act as a low-cost, effective and ergonomic source for PDT light activation over extended periods.

These in-vitro studies are the first to demonstrate PBM and PDT using a QLED device and pave the way for further developments of QLED-based photomedicine.

Figure 8:
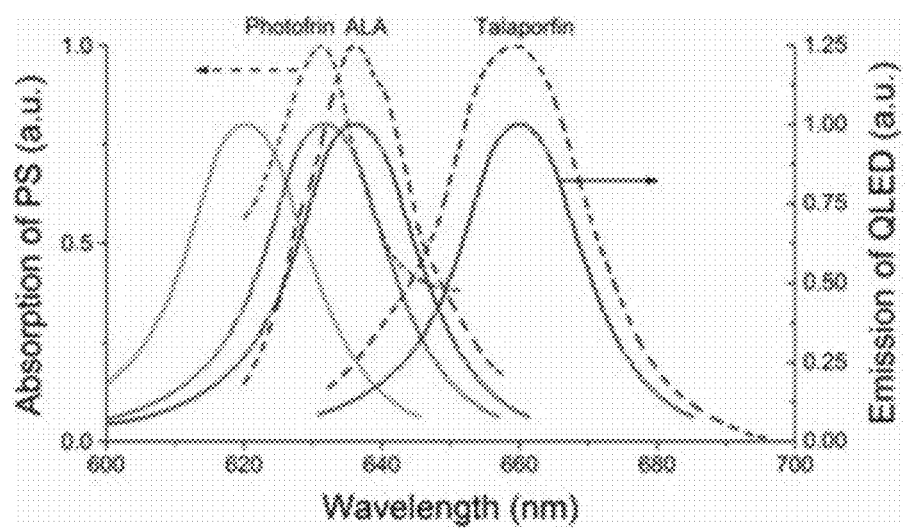
FIG. 8 is a graphical illustration of the absorption spectra (dashed line) of some common photosensitizers (PS) and the target emission spectra of QLEDs (solid line).

It should be noted that these promising preliminary results were obtained with ultrabright red QLED with a peak wavelength of ~620 nm. While this wavelength falls into the favorite range for most photomedical applications (620-670 nm), highly effective phototherapy calls for better wavelength specific spectral control to maximize the absorption for photosensitizers (for PDT) or cytochrome C (for PBM) from QLED. By tuning the synthesis conditions (QDs size and composition), ultrabright QLEDs can be achieved with precisely controlled emission peaks at the following wavelengths for wound repair and cancer treatment applications. As shown in FIG. 8, the absorption spectra (dashed line) of some common photosensitizers (PS) and the target emission spectra of QLEDs (solid line) which are slightly shifted from demonstrated 620 nm. Porfimer sodium (Photofrin®), aminolevulinic acid (ALA) and talaporfin are three photosensitizers widely used for various PDT cancer treatments. FIG. 8 shows an emission peak of 630 nm for porfimer sodium (Photofrin®; PF), a Food and Drug Administration approved photosensitizer widely used for various PDT cancer treatments. FIG. 8 also shows an emission peak of 635 nm for PpIX, which is an endogenous photosensitizer that accumulates after administration of ALA and has been developed for a wide range of applications and Food and Drug Administration approved for PDT treatment of actinic keratosis and an emission peak of 660-670 nm for using 2-1 [hexyloxyethyl]-2-devinylpyropheophorbide-A, Chlorin e6 or talaporfin in PDT, and cytochrome C, the primary light absorbing chromophore for PBM.

Currently, such precise wavelength control can only be realized by expensive, bulky lasers, although the laser light needs to be waveguided with optical fibers and spread out with diffusers for large-area applications. Comparing to lasers, QLED has clear advantages as low-cost, large-area and wearable light sources.

Flexible QLEDs are in obligatory demand to achieve a solution that is functional for a wearable bandage light source. While many groups have demonstrated their flexible devices by simply transferring the QLEDs from rigid substrates to flexible substrates, progress is still needed to further improve the device performance, reliability and to lower the manufacturing cost: 1) Transparent conductor material and process development: conventional QLED on rigid substrates uses indium tin oxide film as bottom conductor layer, which is not stable during repeated bending. Ag nanowire transparent conductor structure with superior surface planarity is more suitable for flexible QLEDs; 2) large-area printing of quantum dot for QLED: large-area printing of quantum dot is still at infancy state. Current lab scale printing using spin coating is not compatible with manufacturing. Electrospraying deposition would be developed for high uniformity; 3) thin film encapsulation for QLED: current thin film encapsulation for flexible OLED requires multiple layers to ensure reliability during cycle bending. By evaluating the requirement of water vapor transmission rate of QLED and developing rather simplified material and structure, flexible QLEDs could be more cost effective.

The preliminary PBM and PDT results will pave the way for applying the bright, pure color red QLEDs in rigid or flexible form factors to positively change phototherapy applications in dermatology, oncology, minimally invasive surgery, stroke and brain disease among other fields.

Following is a detailed discussion on two critical photomedical fields (wound repair and cancer treatments).

With 660-nm QLEDs, laboratories involved in PBM therapy would enable the investigation of wound healing, cellular metabolism and cell proliferation in vitro using multiple cell lines and in animal models of incisional and pressure ulcer wounds. The effect of spectral response, dosimetry and power density on the rate and quality of healing could be evaluated by histology, collagen content and other parameters. The results may be incorporated in future institutional review board-approved human clinical trials to achieve healing of chronic wounds or acceleration of healing of primary wounds using surgical incisions such as hernia incisions, C-sections or breast augmentations.

It had been discovered that PF can be transformed into highly effective light-activated antimicrobials by adding a harmless solution of potassium iodide (KI). The 630-nm QLEDs could be used in vitro to eradicate antibiotic resistant strains of Gram-positive, Gramnegative bacteria and fungi using mixtures of PF and KI. Researchers could also test QLEDs in combination with PF and KI in a mouse model of an infected abrasion wound caused by the bioluminescent drug-resistant pathogen, *Acinenetobacter baumannii*.

Laser-based PDT has previously been successfully transferred into the clinic in the treatment of head and neck and lung cancer with the computer-simulation-assisted optimization of light delivery and dosimetry. Similar methods can be applied to mode light propagation from QLEDs emitting 630, 635 and 665 nm for PDT with PF, 5-ALA and 2-1 [hexyloxyethyl]-2-devinylpyropheophorbide-A, respectively.

FIG. 9A-FIG. 9D presents preliminary results from computer simulation of light propagation in a tissue mimicking geometry irradiated with 630-nm light wavelength delivered from a QLED with known model. In this model, the light source was represented as a flux of photons emitted from the surface of the QLED. The resulting fluence rate (mW/cm$^2$) was computed throughout a cylindrical phantom, which mimicked the optical properties of tissue, when exposed to an input power density of 10 mW/cm$^2$. FIG. 9A-FIG. 9D shows the models of the QLED, the phantom that was used and the resulting fluence rate (mW/cm$^2$) along two cross sections of the phantom (these cross sections are indicated as A and B in FIG. 9B). FIG. 9A illustrates a top-down view of a tissue mimicking geometry irradiated with 630-nm light wavelength delivered from a QLED. FIG. 9B illustrates a side view of a tissue mimicking geometry irradiated with 630-nm light wavelength delivered from a QLED. FIG. 9C is a computer simulation showing the resulting fluence rate (mW/cm2) along one cross section of the phantom (line A from FIG. 9B) and FIG. 9D is a computer simulation showing the resulting fluence rate (mW/cm2) along one cross section of the phantom (line B from FIG. 9B). The simulations suggest that the attenuation of the light emitted from a QLED will depend on the relative location within the device. Thus, the light power will attenuate to 60% of its maximum value in the middle of the phantom (line C, FIG. 9C) and 30% of its maximum value in the middle of the light emitted square (line D, FIG. 9D) at a depth of about 4 mm. In a laser-based PDT with a 8×8 mm source, the light will attenuate to 35% of its maximum value at the center of the laser beam at a depth of 4 mm in the same phantom (data not shown).

The evaluation of 635-nm QLEDs for ALA-PpIX PDT and associated dosimetry of oral malignancies can be carried out using a combination of in-vitro 3D co-culture models and animal models of oral cancers.

Additionally, the ultrabright deep red QLED devices of the present invention provide a light source with sufficient power density for photomedicine where low-cost, wearable, disposable light emitting bandage products are highly desired. Additionally, the narrow emission band and wavelength tenability of the QLEDs make it feasible to better fit the emission spectrum into the absorption window of photosensitizers (for PDT) or cytochrome C (for PBM).

In one embodiment, the QLED device of the present invention is a low cost, wearable, disposable light-emitting bandage product. The QLED bandage product employing ultrabright deep red QLEDs enjoy all form factor merits of OLEDs, while having emission peak widths 3-5 times narrower and power densities 2-4 times higher (under similar driving conditions) than OLEDs for the mid-deep red spectral range. These advantages can translate into over one order improvement in photomedical treatment efficacy over traditional OLEDs. Being solution processable at low costs, QLEDs represent the ideal photomedical light source with all desired features over other lighting strategies.

Preliminary PBM and PDT tests with the ultrabright QLEDs of the present invention as light sources have been carried out in vitro and the experimental results demonstrate that QLED PBM can increase cell metabolism in multiple cell lines by ~11-25% over control systems and QLED PDT can kill cancerous cells, in a similar fashion as inorganic LED arrays.

While promising results of QLEDs-based PDT and PBM have been reported, highly effective phototherapy calls for improved spectral control to maximize the absorption of specific photosensitizers for targeted photomedicine. As a result of the quantum confinement effect, by tuning the QD synthesis conditions (QD's size and composition), highly efficient QD materials with precisely controlled emission peaks at wavelengths between 620 nm-670 nm for targeted medical applications can be achieved. Quantum dots with wavelengths that fit well within the photosensitizers provide better results for PDT and PBM applications.

Figure 10:
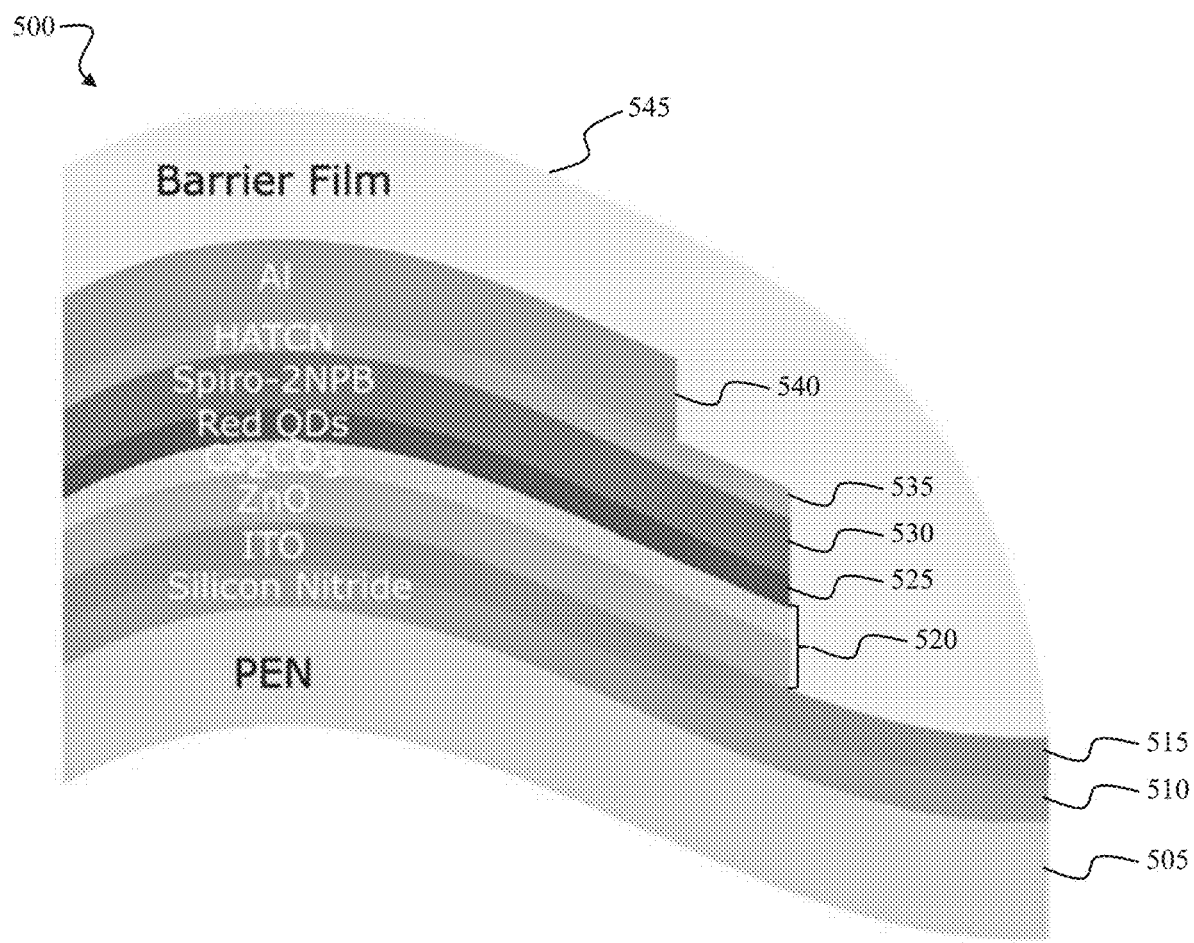
FIG. 10 is an illustration of the structure of an exemplary flexible QLED device having a mixture layer of metal oxide nanoparticles and alkali metal compounds for simultaneous electron injection and hole blocking, in accordance with the present invention.

With reference to FIG. 10, in an exemplary embodiment of a flexible QLED device 400, a polyethylene naphthalate (PEN) film 505 substrate with a transparent indium tin oxide (ITO) cathode conductor 515 and silicon nitride barrier layer 510 between the PEN film 505 and the cathode 515 is provided. The device stack consists of multiple layers comprising ITO 515, ZnO nanoparticles/Cs$_2$CO$_3$ mixture layer 520, CdSe—ZnS—CdZnS core-shellshell QDs layer 525, /2,20,7,70-tetrakis[N-naphthalenyl(phenyl)-amino]-9,9-spirobifluorene layer 530, a 1,4,5,8,9,11-hexaazatriphenylene-hexacarbonitrile layer 535, and an Al anode layer 540. These organic-inorganic hybrid QLED devices were fabricated by a combination of solution-processing and vacuum evaporation techniques as has been previously described. The completed devices were later encapsulated with laminated barrier film 545 developed by Hoist Center (a hybrid thin-film encapsulation stack consisting of two inorganic barrier layers of silicon nitride deposited at low temperature with an organic layer in between.

Figure 11A:
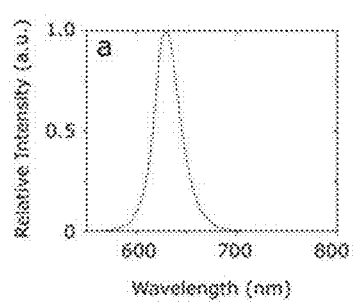
FIG. 11A is a plot illustrating the electroluminescence spectra at 3V for a flexible inverted quantum dot light-emitting device, in accordance with an embodiment of the present invention under ambient conditions.

After encapsulation, the devices were tested in ambient condition. The electroluminescence spectrum, as illustrated in FIG. 11A displays a saturated QD emission profile (FWHM of 28 nm with a peak wavelength of 630 nm), falling right into the absorption range of the commonly used photosensitizer, Photofrin®.

Figure 11B:
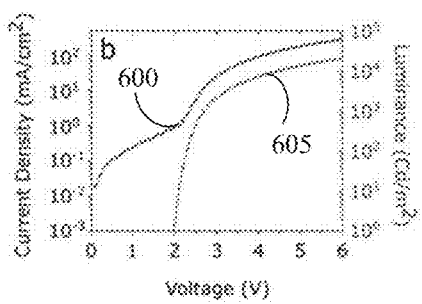
FIG. 11B is a plot illustrating the luminance and current density vs. driving voltage for a flexible inverted quantum dot light-emitting device, in accordance with an embodiment of the present invention under ambient conditions.

FIG. 11B demonstrates the current-density 600 and luminance 605 voltage (J-L-V) characteristics of the flexible devices. With a turn-on voltage of 1.9 V, the QLEDs can achieve a peak external quantum efficiency (EQE) of 8.2% at the current density of 19 mA/cm2, corresponding to a luminance of 1800 cd/m2. Luminance can reach up to over 20,000 cd/m2, which is sufficient for photomedicine treatment, at a current density of 283 mA/cm2 and a driving voltage of only 6 V.

Figure 11C:
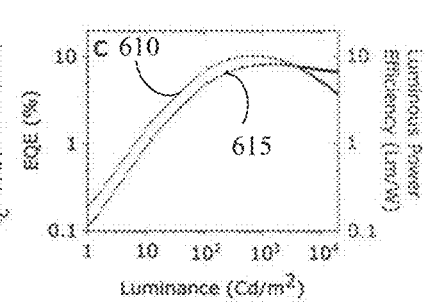
FIG. 11C is a plot illustrating the external quantum efficiency and luminous power efficiency versus luminance for a flexible inverted quantum dot light-emitting device, in accordance with an embodiment of the present invention under ambient conditions.

As shown in FIG. 11C, the devices exhibit relatively low efficiency roll-off at high current densities, compared with typical OLEDs/QLEDs. QLEDs' EQE 615 only dropped 1.5% when luminance 610 increased from 1100 nits (8.2%) to 20,000 nits (6.7%).

Although the lifetime of these flexible QLEDs are limited in air at current status, it is expected that established flexible OLED encapsulation technologies (e.g., atomic layer deposition (ALD) encapsulations) could prolong the lifetime of QLEDs to a level to satisfy clinical requirements of photomedical treatments. Ultrabright flexible QLEDs represent the ideal light sources to work as highly efficient, low-cost, wearable, and disposable bandage products for photomedical treatment in terms of the high luminance wavelength tenability, and narrow spectra.

In a specific application of photomedicine, the treatment of oral cancer or diabetic wounds is addressed. The treatment of these conditions exhibits urgent requirements of device flexibility, light homogeneity, while the device size can be small (<2 cm$^2$) and can thus be fabricated at a low cost.

Oral cancer has been considered as a global health crisis because of its high incidence in India. Although largely preventable, cancers of the oral cavity account for over 30% of cancers reported in India. This is one of the highest oral cancer rates in the world and is largely due to the widespread popularity of chewing gutka, a tobacco mixture with crushed betel nut and acacia extract. Treatment typically consists of surgery and/or radiotherapy, which require expertise and medical infrastructure that are often not available in the settings where they are most needed. Even if the disease is detected relatively early, these interventions can be disfiguring and present major quality of life issues including the ability to chew, swallow, speak, and work, thus increasing the societal economic burden on an already burdened economy. On the other hand, early clinical studies showed that PDT is a safe and effective approach, with remarkable healing and is especially effective for early stage cancerous and precancerous lesions of the oral cavity. While PDT photosensitizer is readily available, the expensive laser light source that is currently main stream treatment option is not.

Wound healing in diabetes mellitus is often impaired and results in nonhealing or long-lasting chronic skin ulcers. Current treatment of the diabetic wound includes systemic glycemic control, local wound care and infection control, revascularization, and pressure relieving strategies. However, results from existing multidisciplinary treatments are often unsatisfactory. PBM with red light has been demonstrated to improve diabetic wound healing by accelerating collagen production, enhancing angiogenesis, increasing wound closure rate, and increasing growth factor expression. While OLEDs have been applied to improve diabetic cutaneous wound healing in rats, their broad emission peaks and relatively low power density remain, limiting the treatment effects.

For both oral cancer treatment and diabetic wound repairs, flexible QLED light source is expected to greatly simplify the light source setup, lower the overall treatment cost, and enhance quality of life of patients.

Although the public concern of cadmium contained in QD materials could be a political challenge without solid biomedical evidences, it should be noted that QLEDs with hermetic encapsulations leave little chance of cadmium leakage. The concern for cadmium can be eased out through serious medical evaluation of the QLED's beneficial treatment effect and close monitoring of any possible side effects.

We perceive that the reported invention can provide wearable light sources for photodynamic therapy for oral cancer treatment or photobiomodulations for diabetic wound repair. Besides these specific near-term market opportunities, we envision that the QLED could be applied in photomedicines for the treatments of other cancers, infections or aesthetic. The preliminary PBM and PDT results will pave the way for applying the bright, pure color red QLEDs in rigid or flexible form factors to positively change phototherapy applications in dermatology, oncology, minimally invasive surgery, stroke and brain disease among other fields.

Overall, as envisioned in these specific examples, the QLED light source could provide an ideal platform for various photomedicine applications. The demonstrations of ultrabright deep red QLEDs and their effectiveness for PBM and PDT warrant further studies investigating QLED devices for photomedical applications. It is believed that the QLED-based technology, initially developed out of strong interests from information display industry, can make inroads into new medical areas, enable the widespread clinical application and acceptance of photomedicine (e.g. PDT and PBM) and have a direct, beneficial impact to mankind by radically changing the ways to manage cancer, acute and chronic wounds, inflammation and antimicrobial resistance among others. The experience and knowledge gained in these developments could help enhance QLED stability and open up wider applications for QLEDs in display and lightings in the future.

In various embodiments of the present invention, the QLED light source of the present invention, including a mixture layer of electron injecting ZnO and a hole blocking $Cs_2CO_3$, provides an ideal platform for various photomedicine applications. The pure color red QLEDs in rigid or flexible form factors can be used to positively change phototherapy applications in dermatology, oncology, minimally invasive surgery, stroke and brain disease, among other fields.

The present invention provides an inverted quantum dot light emitting device that takes advantage of the unique combination of an electron injecting ZnO and a hole blocking $Cs_2CO_3$ in a mixture layer. The device surpasses state-of-the art OLED technology in peak luminance and electroluminescence efficiencies at high current densities. With the additional benefits of solution processability, record low power consumption, and the structural compatibility with n-type transistor backplanes, these results are indicative of QLEDs' great potential for next-generation display, lighting and other novel applications such as photomedicine and optical sensors.

What is claimed is:

1. A quantum dot light-emitting diode (QLED) comprising:
    a quantum dot (QD) light-emitting layer comprising a plurality of quantum dots (QDs); and
    an electron injection and hole blocking layer positioned adjacent to the QD light-emitting layer, the electron injection and hole blocking layer comprising a mixture of a plurality of metal oxide nanoparticles and an alkali metal compound, wherein the QD light-emitting layer is simultaneously in contact with one or more of the metal oxide nanoparticles of the electron injection and hole blocking layer and with the alkali metal compound of the electron injection and hole blocking layer.

2. The QLED of claim 1, further comprising:
    a substrate;
    a cathode layer adjacent to the substrate, wherein the electron injection and hole blocking layer is positioned between the cathode layer and the QD light-emitting layer;
    a hole transport layer adjacent to the QD light-emitting layer;
    a hole injection layer adjacent to the hole transport layer; and
    an anode layer adjacent to the hole injection layer.

3. The QLED of claim 2, wherein the QD layer is a single monolayer, wherein the QD of the single monolayer QD layer is simultaneously in contact with the hole transport layer and the electron injection and hole blocking layer.

4. The QLED of claim 2, wherein the substrate is selected from glass and a transparent polymer.

5. The QLED of claim 2, wherein the cathode layer is selected from doped oxides, undoped oxides, indium tin oxide (ITO), fluorite-type tix dioxide ($F:SnO_2$, FTO), indium zinc oxide (IZO), aluminum-doped zinc oxide (Al:ZnO), indium copper oxide (ICO), cadmium-doped zinc oxide (Cd:ZnO), tin dioxide ($SnO_2$), indium oxide ($In_2O_3$), nickel (Ni), platinum (Pt), gold (Au), silver (Ag), mixed carbon nanotubes and graphene.

6. The QLED of claim 2, wherein the hole transport layer adjacent is selected from 2,2',7,7'-tetrakis[N-naphthalenyl(phenyl)-amino]-9,9-spirobifluorene (spiro-2NPB), LG 101, poly(spiro-fluorene), Poly[N,N'-bis(4-butylphenyl)-N,N'-bis(phenyl)-benzidine] (Poly-TPD), tris(3-methylphenylphenylamino) triphenylamine (m-MTDATA), poly(9,9'-dioctylfluorene-co-N-(4-butylphenyl) diphenylamine (TFB), poly[2-methoxy-5-(2'-ethylhexyloxy)-1,4-phenylene vinylene] (MEH-PPV) and poly[2-methoxy-5-(3,7'-dimethyloctyloxy)-1,4-phenylene vinylene] (MDMO-PPV), Dipyrazino[2,3-f:2',3'-h] quinoxaline-2,3,6,7,10,11-hexacarbonitrile (HATCN).

7. The QLED of claim 2, wherein the hole injection layer is selected from 2,2',7,7'-tetrakis[N-naphthalenyl(phenyl)-amino]-9,9-spirobifluorene (spiro-2NPB), LG 101, poly (spiro-fluorene), Poly[N,N'-bis(4-butylphenyl)-N,N'-bis(phenyl)-benzidine] (Poly-TPD), tris(3-methylphenylphenylamino) triphenylamine (m-MTDATA), poly(9,9'-dioctylfluorene-co-N-(4-butylphenyl) diphenylamine (TFB), poly[2-methoxy-5-(2'-ethylhexyloxy)-1,4-phenylene vinylene] (MEH-PPV) and poly[2-methoxy-5-(3',7'-dimethyloctyloxy)-1,4-phenylene vinylene] (MDMO-PPV), Dipyrazino[2,3-f:2',3'-h] quinoxaline-2,3,6,7,10,11-hexacarbonitrile (HATCN).

8. The QLED of claim 2, wherein the anode layer is selected from doped oxides, undoped oxides, indium tin oxide (ITO), fluorite-type tix dioxide (F: $SnO_2$, FTO), indium zinc oxide (IZO), aluminum-doped zinc oxide (Al:ZnO), indium copper oxide (ICO), cadmium-doped zinc oxide (Cd:ZnO), tin dioxide ($SnO_2$), indium oxide ($In_2O_3$), nickel (Ni), platinum (Pt), gold (Au), silver (Ag), mixed carbon nanotubes and graphene.

9. The QLED of claim 1, wherein the QD layer has a thickness between about 10 nm and about 25 nm.

10. The QLED of claim 1, wherein the quantum dots are selected from Group II-VI compound semiconductor nanocrystals, Group III-V compound semiconductor nanocrystals, Group IV-VI compound semiconductor nanocrystals, copper indium selenide ($CuInSe_2$) nanocrystals, core-shell structured nanocrystals and core-shell-shell structured nanocrystals.

11. The QLED of claim 1, wherein the quantum dots are cadmium selenide (CdSe)-zinc sulfate (ZnS)-cadmium zinc sulfide (CdZnS) core-shell-shell quantum dots.

12. The QLED of claim 1, wherein the metal oxide nanoparticles of the electron injection and hole blocking layer are selected from zinc oxide (ZnO), titanium dioxide ($TiO_2$), zirconium dioxide ($ZrO_2$), tin dioxide ($SnO_2$), tungsten trioxide ($WO_3$) and tantalum oxide ($Ta_2O_3$).

13. The QLED of claim 1, wherein the alkali metal compound is selected from lithium carbonate ($Li_2CO_3$), cesium carbonate ($Cs_2CO_3$), cesium stearate and 8-Hydroxyquinolinolatolithium (Liq).

14. A flexible quantum dot light-emitting diode (QLED) device for performing photomedicine, the QLED device comprising:
at least one quantum dot light-emitting diode (QLED), the at least one QLED comprising;
a flexible substrate;
a barrier layer adjacent to the flexible substrate;
a cathode layer adjacent to the substrate;
an electron injection and hole blocking layer comprising a mixture of a plurality of metal oxide nanoparticles and an alkali metal compound, wherein the electron injection and hole blocking layer is adjacent to the QD light-emitting layer;
a quantum dot light-emitting diode (QLED) layer comprising a plurality of quantum dots (QDs);
a hole transport layer adjacent to the QD light-emitting layer;
a hole injection layer adjacent to the hole transport layer; and
an anode layer adjacent to the hole injection layer.

15. The QLED of claim 14, wherein the photomedicine is selected from photodynamic therapy (PDT) and photobiomodulation (PBM).

16. The flexible QLED device of claim 14, wherein the flexible substrate comprises polyethylene naphthalate, the barrier layer comprises silicon nitride, the cathode layer comprises indium tin oxide (ITO), the electron injection and hole blocking layer comprises zinc oxide (ZnO) nanoparticles and cesium carbonate ($Cs_2CO_3$), the quantum dot light-emitting layer comprises (CdSe)-zinc sulfate (ZnS)-cadmium zinc sulfide (CdZnS) core-shell-shell quantum dots, the hole transport layer comprises 2,2',7,7'-tetrakis[N-naphthalenyl(phenyl)-amino]-9,9-spirobifluorene (spiro-2NPB), the hole injection layer comprises Dipyrazino[2,3-f:2',3'-h] quinoxaline-2,3,6,7,10,11-hexacarbonitrile (HATCN) and the anode layer comprises aluminum (Al).

17. A method of fabricating a quantum dot light-emitting diode (QLED) device, the method comprising:
fabricating a cathode layer on a substrate;
fabricating an electron injection and hole blocking layer comprising a mixture of a plurality of metal oxide nanoparticles and an alkali metal compound onto the cathode layer;
fabricating a quantum dot (QD) light-emitting diode layer comprising a plurality of quantum dots (QDs) on the electron injection and hole blocking layer;
fabricating a hole transport layer on the QD light emitting layer;
fabricating a hole injection layer on the hole transport layer; and
fabricating an anode layer on the hole injection layer.

18. The method of claim 17, wherein the QD layer has a thickness between about 10 nm and about 25 nm.

19. The method of claim 17, wherein the QD layer is a single monolayer, wherein the QD of the single monolayer QD layer is simultaneously in contact with the hole transport layer and the electron injection and hole blocking layer.

20. The method of claim 17, wherein fabricating an electron injection and hole blocking layer comprising a mixture of a plurality of metal oxide nanoparticles and an alkali metal compound onto the cathode layer further comprises, preparing the mixture using zinc oxide (ZnO) nanoparticles and cesium carbonate ($Cs_2CO_3$) and wherein a ratio of ZnO to $Cs_2CO_3$ is between 8:1 and 1:8.

21. The method of claim 17, wherein fabricating an electron injection and hole blocking layer comprising a mixture of a plurality of metal oxide nanoparticles and an alkali metal compound onto the cathode layer further comprises, preparing the mixture using zinc oxide (ZnO) nanoparticles and cesium carbonate ($Cs_2CO_3$) dissolved in a polar solvent, wherein a concentration of ZnO and $Cs_2CO_3$ in the solvent is between about 3 mg/ml and about 40 mg/ml.

22. A method for performing photomedicine, the method comprising:
providing at least one quantum dot light-emitting diode (QLED) device, wherein the at least one QLED device comprises;
a quantum dot light-emitting layer comprising a plurality of quantum dots (QDs); and
an electron injection and hole blocking layer positioned adjacent to the QD light-emitting layer, the electron injection and hole blocking layer comprising a mixture of a plurality of metal oxide nanoparticles and an alkali metal compound, wherein the QD light-emitting layer is simultaneously in contact with one or more of the metal oxide nanoparticles of the electron injection and hole blocking layer and with the alkali metal compound of the electron injection and hole blocking layer.

23. The method of claim 22, wherein the QLED device further comprises:
a substrate;
a cathode layer adjacent to the substrate, wherein the electron injection and hole blocking layer is positioned between the cathode layer and the QD light-emitting layer;
a hole transport layer adjacent to the QD light-emitting layer;

a hole injection layer adjacent to the hole transport layer; and an anode layer adjacent to the hole injection layer.

24. The method of claim 22, wherein the photomedicine is selected from photodynamic therapy (PDT) and photobiomodulation (PBM).

* * * * *